(12) United States Patent
Honcharenko

(10) Patent No.: US 8,855,174 B2
(45) Date of Patent: Oct. 7, 2014

(54) FREQUENCY AGILE MULTIBAND TRANSMITTER USING A RADIO FREQUENCY DIGITAL TO ANALOG CONVERTER

(75) Inventor: Walter Honcharenko, Monmouth JCT, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 103 days.

(21) Appl. No.: 13/572,513

(22) Filed: Aug. 10, 2012

(65) Prior Publication Data

US 2014/0044155 A1    Feb. 13, 2014

(51) Int. Cl.
 *H04B 1/38*    (2006.01)
(52) U.S. Cl.
 USPC ....................................................... 375/219
(58) Field of Classification Search
 USPC ......... 375/211, 219, 259, 260, 285, 295, 296, 375/302
 See application file for complete search history.

(56) References Cited

U.S. PATENT DOCUMENTS

| 8,184,210 | B2* | 5/2012 | Sharma et al. | 348/724 |
| 2003/0227982 | A1* | 12/2003 | Chen et al. | 375/302 |
| 2010/0098191 | A1* | 4/2010 | Morris et al. | 375/322 |

FOREIGN PATENT DOCUMENTS

| WO | 0065722 A1 | 11/2000 |
| WO | 2008009013 A2 | 1/2008 |
| WO | 2013136319 A2 | 9/2013 |

OTHER PUBLICATIONS

International Search Report and Written Opinion correlating to PCT/US2013/052875 dated Nov. 6, 2013, 11 pages.

\* cited by examiner

*Primary Examiner* — Sam K Ahn
*Assistant Examiner* — Syed Haider
(74) *Attorney, Agent, or Firm* — Davidson Sheehan LLP

(57) ABSTRACT

Embodiments of the claimed subject matter provide a method and apparatus for generating a first radio frequency digital signal and providing the first radio frequency digital signal to a radio frequency digital-to-analog converter operating at a sampling frequency. The output of the radio frequency digital-to-analog converter includes a first carrier signal corresponding to the first radio frequency digital signal and having a first frequency below the sampling frequency and an image of the first carrier signal having a second frequency above the sampling frequency. The output of the radio frequency digital-to-analog converter is filtered to select the image of the first carrier signal for transmission.

14 Claims, 2 Drawing Sheets

FREQUENCY AGILE MULTIBAND TRANSMITTER USING A RADIO FREQUENCY DIGITAL TO ANALOG CONVERTER

BACKGROUND

This application relates generally to communication systems, and, more particularly, to a frequency agile multiband transmitter using a radio frequency digital to analog converter.

Wireless communication systems typically include base stations that provide wireless connectivity to cover a geographical area such as a cell or a sector of a cell. The base stations communicate with mobile units in the cell or sector over an air interface. The air interface supports downlink (or forward link) communication from the base station to the mobile unit and uplink (or reverse link) communication from the mobile unit to the base station. The uplink and downlink communication uses corresponding uplink and downlink channels, which may be realized by use of carrier frequency, modulation, coding, frequency/time multiplexing, multiple antenna techniques, or combination thereof. Examples of standards and protocols that are used to define uplink and/or downlink channels include Time Division Multiple Access (TDMA), Frequency Division Multiple Access (FDMA), Multiple Input Multiple Output (MIMO), Code Division Multiple Access (CDMA), Orthogonal Frequency Division Multiple Access (OFDMA), Spatial Division Multiple Access (SDMA), Single Carrier Frequency Division Multiple Access (SC-FDMA), and the like.

The evolution of cellular telephony and wireless communication networks in conjunction with an increased availability of spectrum across various frequencies and bands has forced service providers to create novel strategies to reduce operating costs and total cost of ownership. One method of reducing operating costs it to reduce the overall amount of radio hardware deployed, which carries with it the expenses of zoning, power consumption, up-front hardware costs, and maintenance.

Traditionally, wireless base stations operate in one band. Operators who have several bands of disaggregate spectrum typically deploy base stations for each operating frequency band, with the appropriate ancillary equipment, including antennas, cables, power supplies, etc. A goal of hardware manufacturers and operators is to reduce hardware and provide base stations that concurrently cover multiple frequency bands. In a multiband environment, a base station that concurrently provides coverage in different frequency bands may be used to reduce hardware requirements.

Multiband transmitter architectures typically use several radio paths, and combine the paths at radio frequency (RF) either before or after the power amplifier. On a single radio board, conventional multiband architectures would provide duplicate signal processing paths and RF paths, and combine post RF modulation. The radio provides each band to a combiner which then outputs the signal to the wideband/multiband amplifier. The dual path approach increases the component count which impacts reliability, requires several local oscillators (LOs) which can induce spurious emissions, requires synchronization of crest factor reduction (CFR) and digital predistortion (DPD) systems across the two LOs with different timebase and propagation delays through the analog paths, and requires phase synchronization of the observation receiver on independent data captures with various group delays in transmit paths.

SUMMARY OF EMBODIMENTS

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, a method is provided for generating a first radio frequency digital signal and providing the first radio frequency digital signal to a radio frequency digital-to-analog converter operating at a sampling frequency. The output of the radio frequency digital-to-analog converter includes a first carrier signal corresponding to the first radio frequency digital signal and having a first frequency below the sampling frequency and an image of the first carrier signal having a second frequency above the sampling frequency. The output of the radio frequency digital-to-analog converter is filtered to select the image of the first carrier signal for transmission.

In another embodiment a transceiver includes a first numerically controlled oscillator, a radio frequency digital-to-analog converter, and a filter. The first numerically controlled oscillator is operable to modulate a first base band signal at a first frequency to generate a first radio frequency digital signal. The radio frequency digital-to-analog converter operates at a sampling frequency and is operable to receive the first radio frequency digital signal and generate a first carrier signal corresponding to the first radio frequency digital signal and having a first frequency below the sampling frequency and an image of the first carrier signal having a second frequency above the sampling frequency. The filter is operable to select the image of the first carrier signal for transmission.

BRIEF DESCRIPTION OF THE DRAWINGS

The disclosed subject matter may be understood by reference to the following description taken in conjunction with the accompanying drawings, in which like reference numerals identify like elements, and in which.

Figure 1:
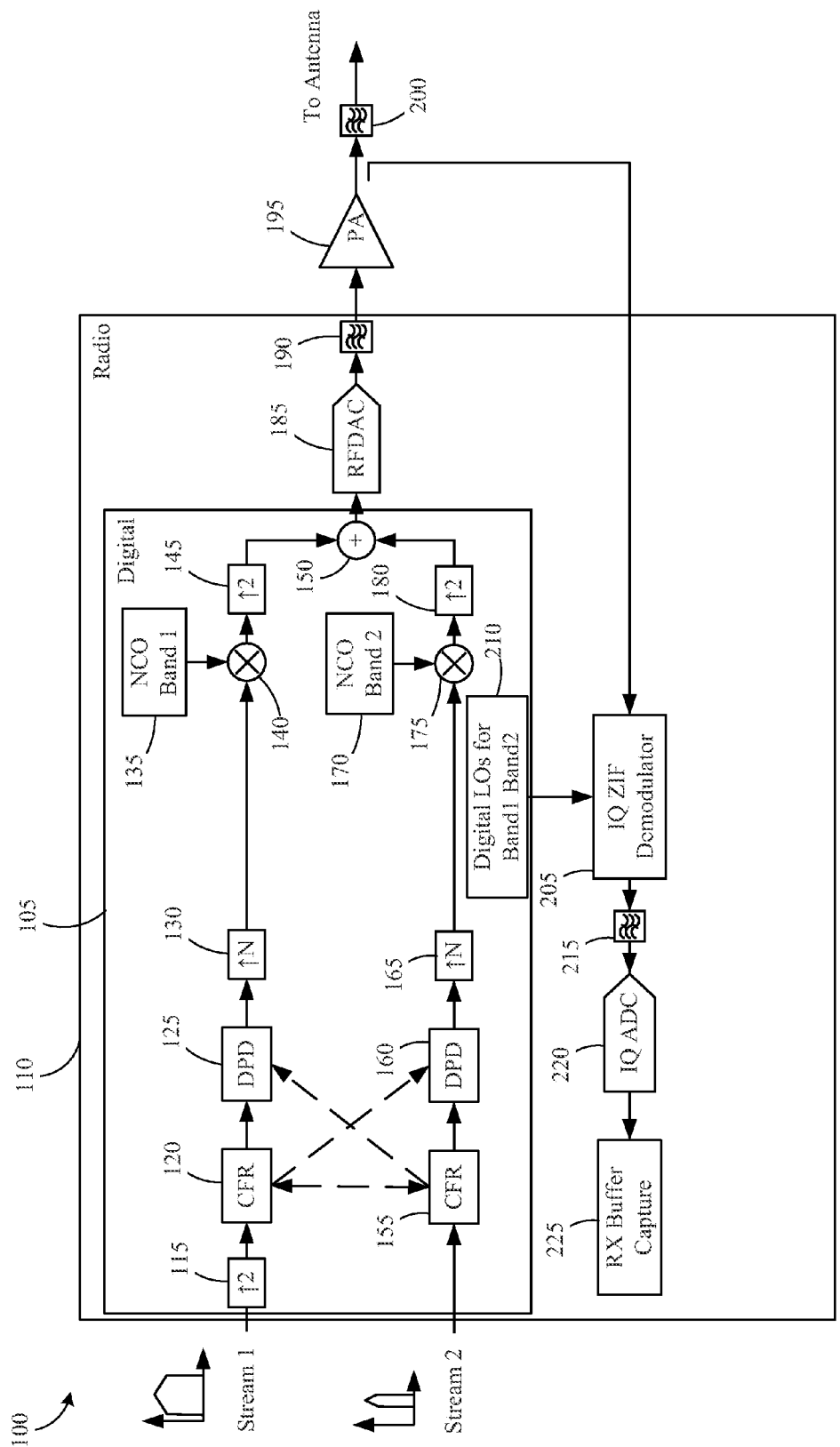
FIG. 1 conceptually illustrates an exemplary embodiment of a transceiver.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. The description and drawings merely illustrate the principles of the claimed subject matter. It will thus be appreciated that those skilled in the art may be able to devise various arrangements that, although not explicitly described or shown herein, embody the principles described herein and may be included within the scope of the claimed subject matter. Furthermore, all examples recited herein are principally intended to be for pedagogical purposes to aid the reader in understanding the principles of the claimed subject matter and the concepts contributed by the inventor(s) to furthering the art, and are to be construed as being without limitation to such specifically recited examples and conditions.

The disclosed subject matter will now be described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. Additionally, the term, "or," as used herein, refers to a non-exclusive "or," unless otherwise indicated (e.g., "or else" or "or in the alternative"). Also, the various embodiments described herein are not necessarily mutually exclusive, as some embodiments can be combined with one or more other embodiments to form new embodiments.

FIG. 1 conceptually illustrates a first exemplary embodiment of a transceiver 100. In general, the transceiver 100 is operable to support multiband operation by generating the broadcast signals in the digital domain upstream of the digital-to-analog conversion function. For purposes of clarity and to avoid obscuring the present subject matter, only the transmitter portions of the transceiver 100 are illustrated. In the illustrated embodiment, the transceiver 100 supports two or more broadcast bands. For example, one band may be located in the range from 700-900 MHz and the other band may be located in the range from 1.9-2.2 GHz. These bands carry Long Term Evolution (LTE), CDMA, and/or Universal Mobile Telecommunications System (UMTS)/High Speed Data Packet Access (HSDPA) signals. However, the subject matter may be adapted to generate more than two bands or different frequency bands using the approaches described herein.

The transceiver 100 includes a digital unit 105 and a radio unit 110. The digital unit 105 may be implemented using a field-programmable gate array (FPGA). The band 1 path in the digital unit 105 includes an upsample unit 115, a crest factor reduction (CFR) unit 120, a digital predistortion unit 125, an upsampling unit 130, a numerically controlled oscillator (NCO) 135 for band 1, a mixer 140, and an upsampling unit 145. The output of the band 1 path is provided to a mixer 150. The band 2 path includes a crest factor reduction (CFR) unit 155, a digital predistortion unit 160, an upsampling unit 165, a numerically controlled oscillator (NCO) 170 for band 2, a mixer 175, and an upsampling unit 180. The output of the band 2 path is provided to the mixer 150. To support concurrent communication in additional bands, additional transmit paths could be provided.

The radio unit 110 includes a radio frequency digital-to-analog converter (RFDAC) 185 and a filter 190. The RFDAC 185 may be implemented using an AD9129 offered by Analog Devices, Inc. of Norwood, Mass. The output of the filter 190 is provided to a power amplifier 195, and the output of the power amplifier 195 is provided to a filter 200. The output of the filter 200 is provided to an antenna (not shown) of the transceiver 100. In one embodiment, the sampling frequency of the RFDAC 185 may be about 1800 MHz, where an exemplary LTE signal may be provided at approximately 750 MHz, and a CDMA signal may be provided at approximately 1960 MHz, and/or a UMTS signal may be provided at approximately 2140 MHz.

A feedback path is provided on the radio unit 110 for configuring the CFR units 120, 155 and the DPD units 125, 160. The feedback path includes an in-phase/quadrature zero intermediate frequency (IQ ZIF) demodulator 205, a digital local oscillator unit 210 that provides the band frequencies to the demodulator 204, a filter 215, an IQ analog-to-digital converter (IQ ADC) 220, and an RX buffer capture unit 225. The operation of the CFR units 120, 155 and the DPD units 125, 160 in conjunction with the elements of the feedback path is known to those of ordinary skill in the art. In general, crest factor reduction limits the dynamic range of the transmit signals. Digital predistortion processing is technique that linearizes the output of the power amplifier 195 by measuring and cancelling out higher order components. The feedback path measures these non-linearities and allows then to be adaptively cancelled. Limiting the dynamic range of the signals using the CFR units 120, 155 helps aid linearization in the DPD units 125, 160.

The use of the various upsampling units 115, 130, 145, 165, 180 is also known to those of ordinary skill in the art to modify the sample rate of the digital signal. The degree of upsampling and the number of upsampling units may vary depending on the particular implementation and the frequency band selected.

As will be described in greater detail below, the frequencies of the NCOs 135, 170 are selected to generate transmit signals in the desired bands. At least one of the transmission bands is located in a frequency range above the sampling frequency of the RFDAC 185 (e.g., in Nyquist band 3). The NCO 170 injects the signal at a frequency that is less than the sampling frequency of the RFDAC 185, and an image of the injected signal that appears in the higher Nyquist band is selectively filtered and transmitted by the transceiver 100. By controlling the injection frequency of the NCOs 135, 170 and the sampling frequency of the RFDAC 185, the particular frequencies of the carriers and the images may be controlled. For example, with a sampling frequency near 1.8 GHz (i.e., approximately twice that of the LTE carrier signal), a CDMA carrier signal may be provided at around 119 MHz and an image may appear at about 1960 MHz.

Figure 2:
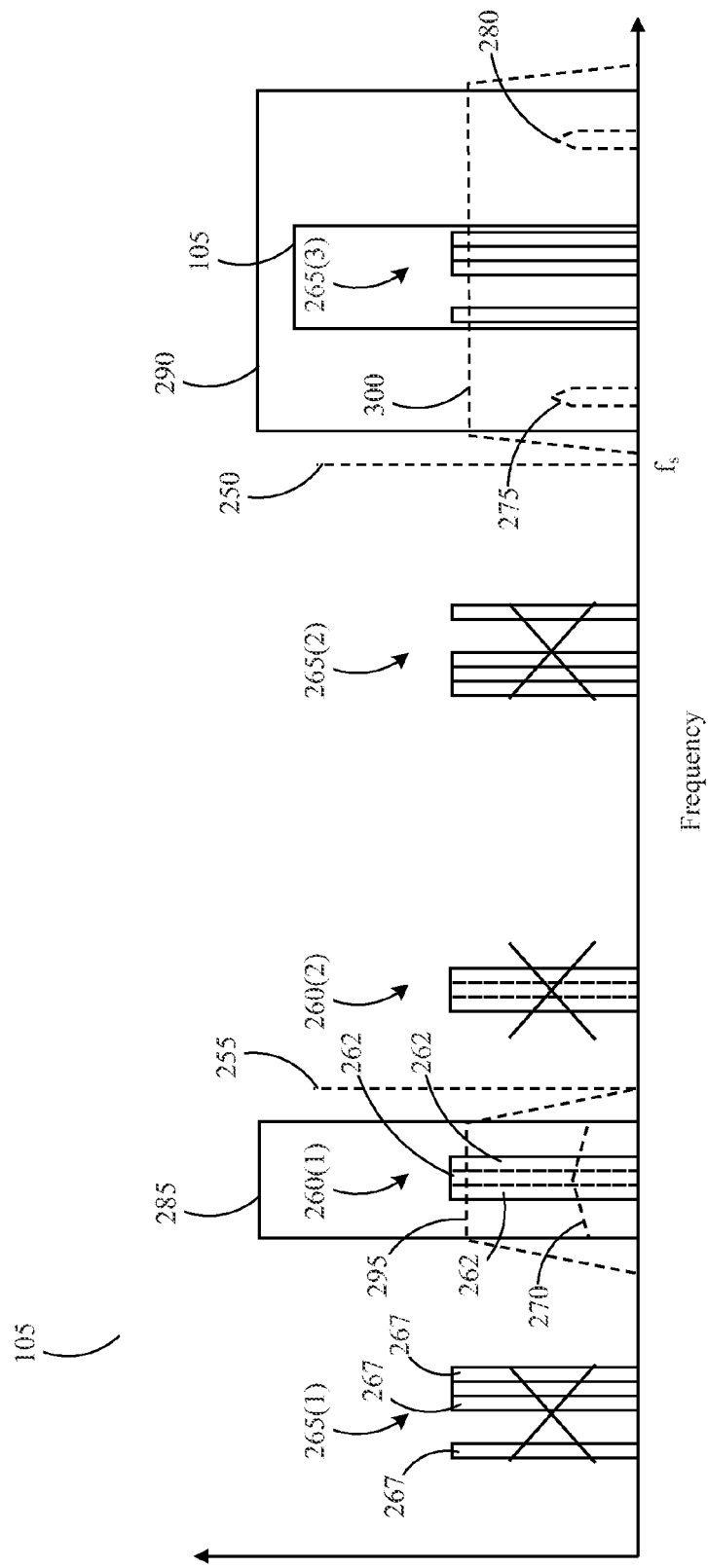
FIG. 2 is a frequency diagram illustrating the operation of the transceiver of FIG. 1.

Turning now to FIG. 2, a diagram of the frequency response of the transceiver 100 is provided. In the illustrated embodiment, the transceiver 100 is configured to generate a CDMA signal and an LTE signal. Line 250 represents the sampling frequency, $f_s$ of the RFDAC 185. The first Nyquist band (i.e., $f<0.5\ f_s$) is represented by line 255, the second Nyquist band is defined between lines 255 and 250 (i.e., $0.5\ f_s<f<f_s$), and the third Nyquist band is defined above line 250 (i.e., $f_s<f<1.5\ f_s$).

The output of the NCO 135 is modulated by a first baseband signal using the mixer 140 to generate a first carrier signal 260(1) in the first Nyquist band for the LTE signal. In the illustrated embodiment, the first carrier signal 260(1) includes multiple subcarriers 262. The output of the NCO 170 is modulated by a second baseband signal using the mixer 175 to generate a second carrier signal 265(1) in the first Nyquist band for the CDMA signal. In the illustrated embodiment, not all of the available subcarriers 267 are used. Of course, any number and arrangement of subcarriers 262, 267 may be used. The NCOs 135, 170 may have multiple stages with differing mixing frequencies for controlling the resolution of the signals, as is known in the art. For example, an NCO with a lower frequency signal may be used to modulate the base band signal followed by an NCO at the target frequency.

Images 260(2), 265(2) of the carrier signals 260(1), 265(1) are present in the second Nyquist band, and an image 265(3) of the carrier signal 265(1) is present in the third Nyquist band. For ease of illustration the image of the carrier signal 260(1) in the third Nyquist band has been omitted. The transceiver 100 is configured to use the carrier signal 260(1) and the carrier signal image 265(3) as its carriers. The frequency of the carrier signal image 265(3) is at the target frequency of the LTE band.

Block 270 represents the intermodulation distortion products of the carrier signal 260(1), and blocks 275, 280 represent the intermodulation distortion products (IMDs) of the carrier signal 265(3). Block 285 represents the DPD bandwidth employed by the DPD unit 125 for canceling IMDs 270, and block 290 represents the DPD bandwidth employed by the DPD unit 160 for canceling the IMDs 275, 280.

The carrier signals 260(1), 265(3) transmitted by the transceiver 100 are selected by the filter 190. The filter 190 has a first pass band 295 for selecting the carrier signal 260(1) and a second pass band 300 for selecting the carrier signal image 265(3).

By using the image 265(3) of the carrier signal 265(1) the transmission signal may be located in a transmission band greater than the sampling frequency of the RFDAC 185. Nyquist sampling rules are satisfied because the carrier signal 265(1) is injected in the first Nyquist band. Lowering the sampling rate reduces power consumption and improves D/A noise performance. The particular location of the carrier signal image 265(3) may be selected by appropriately selecting the injection frequency of the carrier signal 265(1) and the sampling frequency of the RFDAC 185.

The transceiver 100 employs the RFDAC 185 to support concurrent multiband operation for different applications. For example, to provide wideband support for wireless backhaul applications operating in the range from 450 MHz-700 MHz with 250 MHz instantaneous bandwidth, the RFDAC 185 may be provided with a sampling frequency of about 600 Mhz. The architecture also simplifies the radio board design by eliminating the RF modulators and mixer present in a conventional radio board, obviating the need to tune or match the RF components. This simplification reduces the overall cost and power consumption, and also increases reliability by reducing the component count. Digital upconversion limits phase noise and jitter. The digital local oscillators eliminate phase lock loop locking issues, as there is no differential phase noise between the multiple paths. The platform is flexible and reconfigurable to address disaggregate spectrum uses or multiple service providers with separate bands.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A method, comprising:
generating a first radio frequency digital signal;
providing the first radio frequency digital signal to a radio frequency digital-to-analog converter operating at a sampling frequency, an output of the radio frequency digital-to-analog converter comprising a first carrier signal corresponding to the first radio frequency digital signal and having a first frequency below the sampling frequency and an image of the first carrier signal having a second frequency above the sampling frequency;

filtering the output of the radio frequency digital-to-analog converter to select the image of the first carrier signal for transmission;

generating a second radio frequency digital signal;

mixing the first radio frequency digital signal with the second radio frequency digital signal;

providing the mixed first radio frequency digital signal and second radio frequency digital signal to the radio frequency digital-to-analog converter, the output of the radio frequency digital-to-analog converter comprising the first carrier signal and a second carrier signal corresponding to the second radio frequency digital signal; and filtering the output of the radio frequency digital-to-analog converter to select the second carrier signal and the image of the first carrier signal for transmission.

2. The method of claim 1, wherein filtering the output of the radio frequency digital-to-analog converter comprises blocking the first carrier signal.

3. The method of claim 1, wherein the second carrier signal comprises an image of a third carrier signal corresponding to the second radio frequency digital signal, the second carrier signal having a third frequency greater than the sampling frequency.

4. The method of claim 1, wherein the second carrier signal has a third frequency less than half of the sampling frequency.

5. The method of claim 1, wherein generating the first radio frequency signal comprises modulating an output of a first numerically controlled oscillator operating at the first frequency using a first base band signal.

6. The method of claim 1, wherein generating the first radio frequency signal comprises modulating an output of a first numerically controlled oscillator operating at the first frequency using a first base band signal and generating the second radio frequency signal comprises modulating an output of a second numerically controlled oscillator operating at the second frequency using a second base band signal.

7. The method of claim 1, further comprising providing the image of the first carrier signal to a power amplifier.

8. A transceiver, comprising:

a first numerically controlled oscillator configured to modulate a first base band signal at a first frequency to generate a first radio frequency digital signal;

a radio frequency digital-to-analog converter operating at a sampling frequency and configured to receive the first radio frequency digital signal and generate a first carrier signal corresponding to the first radio frequency digital signal and having a first frequency below the sampling frequency and an image of the first carrier signal having a second frequency above the sampling frequency; and a filter configured to select the image of the first carrier signal for transmission;

a second numerically controlled oscillator configured to modulate a second base band signal at a third frequency to generate a second radio frequency digital signal; and a mixer configured to mix the first radio frequency digital signal with the second radio frequency digital signal, wherein the radio frequency digital-to-analog converter is configured to receive the mixed first radio frequency digital signal and second radio frequency digital signal, an output of the radio frequency digital-to-analog converter comprises the first carrier signal and a second carrier signal corresponding to the second radio frequency digital signal, and the filter is configured to filter the output of the radio frequency digital-to-analog converter to select the second carrier signal and the image of the first carrier signal for transmission.

9. The transceiver of claim 8, wherein the filter is configured to block the first carrier signal.

10. A transceiver, comprising:

a first numerically controlled oscillator configured to modulate a first base band signal at a first frequency to generate a first radio frequency digital signal;

a radio frequency digital-to-analog converter operating at a sampling frequency and configured to receive the first radio frequency digital signal and generate a first carrier signal corresponding to the first radio frequency digital signal and having a first frequency below the sampling frequency and an image of the first carrier signal having a second frequency above the sampling frequency; and a filter configured to select the image of the first carrier signal for transmission;

a second numerically controlled oscillator configured to modulate a second base band signal at a third frequency to generate a second radio frequency digital signal; and a mixer configured to mix the first radio frequency digital signal with the second radio frequency digital signal, wherein the radio frequency digital-to-analog converter is configured to receive the mixed first radio frequency digital signal and second radio frequency digital signal, an output of the radio frequency digital-to-analog converter comprises the first carrier signal, a second carrier signal corresponding to the second radio frequency digital signal, and an image of the second carrier signal having a fourth frequency greater than the sampling frequency, and the filter is configured to filter the output of the radio frequency digital-to-analog converter to select the image of the second carrier signal and the image of the first carrier signal for transmission.

11. The transceiver of claim 8, wherein the third frequency is less than half of the sampling frequency.

12. The transceiver of claim 8, further comprising a power amplifier coupled to the filter.

13. A transceiver, comprising:

a first numerically controlled oscillator configured to modulate a first base band signal at a first frequency to generate a first radio frequency digital signal;

a second numerically controlled oscillator configured to modulate a second base band signal at a second frequency to generate a second radio frequency digital signal;

a mixer configured to mix the first radio frequency digital signal with the second radio frequency digital signal;

a radio frequency digital-to-analog converter operating at a sampling frequency greater than the first and second frequencies and configured to receive the first and second radio frequency digital signals and generate first and second carrier signals corresponding to the first and second radio frequency digital signals, respectively, and an image of at least the first carrier signal having a third frequency above the sampling frequency; and a filter configured to select the image of the first carrier signal and the second carrier signal for transmission.

14. The transceiver of claim 13, further comprising a power amplifier coupled to the filter.

* * * * *